United States Patent
Tilbor et al.

(10) Patent No.: US 7,737,715 B2
(45) Date of Patent: Jun. 15, 2010

(54) COMPENSATION FOR VOLTAGE DROP IN AUTOMATIC TEST EQUIPMENT

(75) Inventors: Eran Tilbor, M.P. Misgav (IL); Mordechay Weisblum, Hoshaaya (IL); Michael Grinfeld, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 11/780,395

(22) Filed: Jul. 19, 2007

(65) Prior Publication Data

US 2008/0024159 A1  Jan. 31, 2008

Related U.S. Application Data

(60) Provisional application No. 60/820,857, filed on Jul. 31, 2006.

(51) Int. Cl.
 G01R 31/26 (2006.01)
(52) U.S. Cl. .................... 324/765; 324/158.1
(58) Field of Classification Search ......... 324/754–765, 324/158.1
See application file for complete search history.

(56) References Cited

U.S. PATENT DOCUMENTS

| | | | | |
|---|---|---|---|---|
| 5,101,153 | A | | 3/1992 | Morong ...................... 324/537 |
| 5,519,331 | A | | 5/1996 | Cowart et al. ............... 324/755 |
| 5,563,509 | A | * | 10/1996 | Small ...................... 324/158.1 |
| 5,617,035 | A | | 4/1997 | Swapp ....................... 324/711 |
| 5,909,034 | A | * | 6/1999 | Soldavini et al. .............. 257/48 |
| 5,917,331 | A | * | 6/1999 | Persons ...................... 324/765 |
| 6,077,091 | A | * | 6/2000 | McKenna-Olson et al. .... 439/71 |
| 6,087,895 | A | * | 7/2000 | Ono ............................ 327/565 |
| 6,220,884 | B1 | | 4/2001 | Lin ............................. 439/342 |
| 6,331,770 | B1 | * | 12/2001 | Sugamori ................. 324/158.1 |
| 6,462,570 | B1 | * | 10/2002 | Price et al. .................. 324/754 |
| 6,489,791 | B1 | * | 12/2002 | Tsujii ......................... 324/755 |
| 6,747,470 | B2 | | 6/2004 | Muhtaroglu et al. ........ 324/765 |
| 6,828,775 | B2 | | 12/2004 | Chow et al. .............. 324/158.1 |
| 6,885,213 | B2 | * | 4/2005 | Sunter ........................ 324/765 |
| 6,891,384 | B2 | * | 5/2005 | Mardi et al. ................. 324/754 |
| 6,970,798 | B1 | | 11/2005 | Cao et al. .................... 702/120 |
| 7,046,027 | B2 | | 5/2006 | Conner ....................... 324/765 |
| 7,084,659 | B2 | | 8/2006 | Delucco et al. ............. 324/765 |
| 7,141,994 | B2 | | 11/2006 | Akram ....................... 324/754 |

(Continued)

FOREIGN PATENT DOCUMENTS

GB  2194863 A  *  3/1988

(Continued)

*Primary Examiner*—Ha Tran T Nguyen
*Assistant Examiner*—Richard Isla Rodas

(57) ABSTRACT

Providing reliable testing of a device under test (DUT) by compensating for a reduced voltage inside the device without changing the internal circuitry of the device. The DUT has multiple connection terminals for connecting to the test equipment including at least first and second power connection terminals that both connect to an internal power bus of the DUT. An adapter board connects to the multiple connection terminals of the DUT via a removably attachable socket which holds the DUT. A tester supplies power to the DUT through the adapter board. The adapter board is configured to supply power from the tester to the DUT through the first power connection terminal and to monitor voltage at the second power connection terminal. The tester includes a compensation unit which controls power based on the voltage monitored at the second power connection terminal.

14 Claims, 3 Drawing Sheets

U.S. PATENT DOCUMENTS

| | | | |
|---|---|---|---|
| 7,288,951 B1 * | 10/2007 | Bailey et al. | 324/760 |
| 2001/0013790 A1 * | 8/2001 | Kusumoto | 324/765 |
| 2002/0186037 A1 * | 12/2002 | Eldridge et al. | 324/765 |
| 2004/0051551 A1 | 3/2004 | Sunter | 324/765 |
| 2005/0285613 A1 * | 12/2005 | Isakharov et al. | 324/765 |

FOREIGN PATENT DOCUMENTS

| | | |
|---|---|---|
| WO | 2006/068966 | 6/2006 |

* cited by examiner

COMPENSATION FOR VOLTAGE DROP IN AUTOMATIC TEST EQUIPMENT

CROSS-REFERENCE TO RELATED APPLICATION

This application claims the benefit of U.S. Provisional Patent Application No. 60/820,857, filed Jul. 31, 2006, the contents of which are hereby incorporated by reference as if fully stated herein.

BACKGROUND

1. Field of the Invention

The invention relates to automatic test equipment and more specifically to pre-test compensation for power applied by automatic test equipment to a device under test.

2. Description of the Related Art

Production testing of integrated circuits uses generic automatic test equipment (ATE) and a special-purpose adapter board to connect an arbitrary integrated circuit device under test (DUT) to a standard ATE interface. The typical adapter board is a printed circuit board (PCB) that is connected to the ATE and contains a socket to removably insert the DUT.

During testing, and particularly during high performance testing, there is often a voltage drop in power supplied to the DUT across the connection between the DUT and the socket. This voltage drop is different for each DUT insertion because of changes in connection resistance between the socket and the DUT. Additionally, this voltage drop is not representative of a voltage drop observed during field use of the device where the device may be connected via a permanently attachable socket with lower contact resistance.

The voltage drop across the socket may reduce the power at internal busses inside the DUT and lead to unreliable tests. Therefore, the test equipment may need to increase the voltage supplied to power the DUT to compensate for the voltage drop across the socket and produce reliable tests.

Because the voltage drop across the socket is different for each DUT insertion, a predetermined voltage increase may not compensate for the voltage drop. Rather, the test equipment may need to supply a unique voltage increase with each DUT insertion to compensate for the reduced voltage at internal busses inside the DUT.

U.S. Published App. No. 2004/0051551 proposes one solution to this problem, but the proposed solution requires a change to the internal circuitry of a DUT. These solutions require adding an additional voltage sensing connection terminal to the DUT for monitoring a voltage at the internal bus. These solutions involve adjusting the power supplied to the DUT until the voltage monitored at the sensing connection terminal is equal to a target voltage. These existing solutions have the problem of requiring changing the design of the DUT, which can be expensive and have unintended consequences on actual in-field usage of the DUT.

There exists a need, therefore, for providing reliable tests using test equipment by compensating for reduced voltage at an internal bus inside a DUT that preferably does not change the internal circuitry of the DUT.

SUMMARY OF THE INVENTION

This invention capitalizes on the observation by the inventors herein that many of the tested DUTs, such as application-specific integrated circuits (ASIC), have multiple power connection terminals for the supply of power. These devices will still operate satisfactorily even if some of the multiple power connection terminals are not used to supply power. Moreover, because all of the multiple power connection terminals are connected to the internal power bus of the DUT, some connection terminals can be used during testing to monitor a voltage of the internal power bus of the device, while still supporting application power feeding during operation in the field.

Thus, according to one feature, the invention provides for testing of a DUT that has multiple connection terminals including at least first and second power connection terminals that both connect to an internal power bus of the DUT. The test equipment comprises an adapter board configured to connect to the multiple connection terminals of the DUT via a removably attachable socket which holds the DUT, and a tester which sends and receives test signals to the DUT through the adapter board and which supplies power to the DUT through the adapter board. The adapter board is configured to supply power from the tester to the DUT through the first power connection terminal and to monitor voltage at the second power connection terminal. The tester includes a compensation unit which controls power based on the voltage monitored at the second power connection terminal. A pre-test compensating step compensates power supplied to the DUT so that power at the internal bus, as monitored via the second power connection terminal, reaches a target voltage. Thereafter, testing proceeds through the connection terminals.

By virtue of the foregoing arrangement, a voltage of an internal bus of the DUT can be monitored, ordinarily without changing the internal circuitry of the DUT. Thus, this arrangement produces reliable tests without incurring additional costs and creating unintended consequences associated with changing the internal circuitry of a DUT.

In another aspect of the invention, the adapter board is configured to monitor the voltage through a buffer so that voltage noise is reduced. A low pass filter may be used as the buffer.

In another aspect of the invention, the test equipment operates in a pre-test mode and a test mode, and power is controlled only in pre-test mode and power is fixed during test mode.

In another aspect of the invention, the test equipment switches from the pre-test mode to the test mode when power supplied to the DUT is sufficient so that the voltage monitored at the second power connection terminal is equal to a target voltage.

In another aspect of the invention, the internal power bus comprises a Vdd component and a Vss component, there are first and second power connection terminals which both connect to the Vdd component, and third and fourth power connection terminals which both connect to the Vss component. The adapter board is configured to supply power from the tester to the DUT through the first and third connection terminals and to monitor voltage at the second and fourth power connection terminals. The compensation unit controls power based on the voltage monitored at the second and fourth power connection terminals.

In another aspect of the invention the multiple connection terminals include multiple signal connection terminals, and the test equipment performs testing in the test mode by supplying an input signal to the DUT through an input signal connection terminal, extracting an output signal from the DUT through an output signal connection terminal, and comparing the value of the output signal to a value in a test specification.

In another aspect of the invention, the DUT includes application specific integrated circuits (ASIC). The DUTs may be provided in pin grid array (PGA) packages or ball grid array (BGA) packages.

In another aspect of the invention, the adapter board includes printed circuit boards (PCB), and the socket is removably attachable thereto. The socket may include pogo pins.

In another aspect, of the invention provides a method for supplying power to a DUT in test equipment. The DUT has multiple connection terminals for connecting to the test equipment including at least first and second power connection terminals that both connect to an internal power bus of the DUT. The method comprises a configuring step of configuring the test equipment to supply power to the first power connection terminal, a monitoring step of monitoring a voltage level at the second power connection terminal, and a controlling step of controlling power supplied to the first power connection terminal based on the voltage level monitored at the second power connection terminal.

In another aspect of the invention, the internal power bus comprises a Vdd component and a Vss component, the first and second power connection terminals both connect to the Vdd component, and there are third and fourth power connection terminals which both connect to the Vss component. The configuring step configures the test equipment to supply power to the first and third power connection terminals and monitor voltage levels at the second and fourth power connection terminals. The controlling step controls power supplied to the first and third power connection terminals based on the voltage levels monitored at the second and fourth power connection terminals.

This brief summary has been provided so that the nature of the invention may be understood quickly. A more complete understanding of the invention can be obtained by reference to the following detailed description, appended claims, and accompanying drawings.

DETAILED DESCRIPTION

Figure 1:
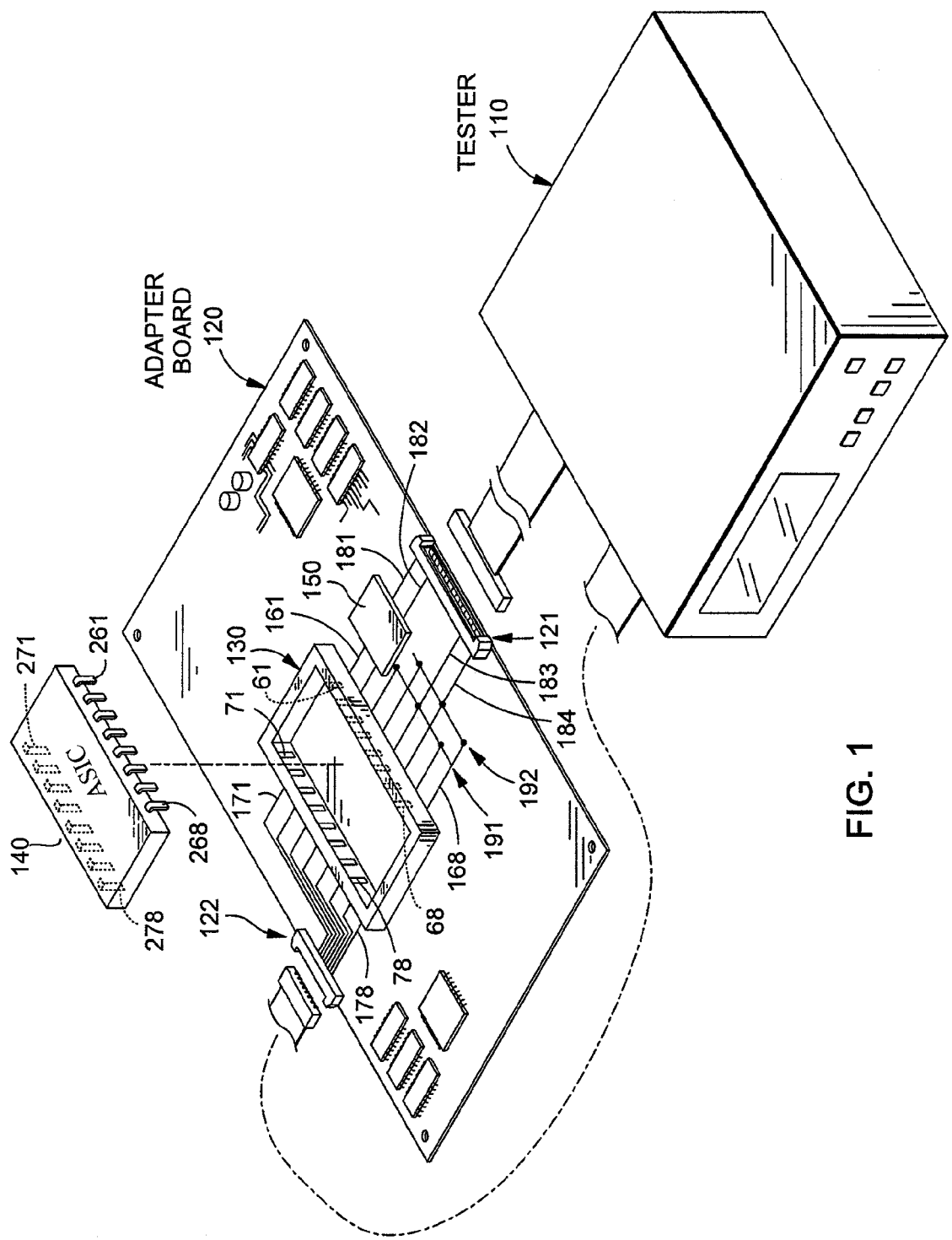
FIG. 1. is a drawing depicting test equipment configured for testing a device in accordance with an exemplary embodiment of the invention.

FIG. 1. is a drawing depicting a device under test (DUT) and test equipment configured for testing the DUT in accordance with an exemplary embodiment of the invention. The test equipment includes an adapter board, such as adapter board 120, and a tester, such as tester 110.

Device 140 is a DUT, such as an application specific integrated circuit (ASIC) semiconductor device, or any other suitable DUT. Device 140 includes connection terminals, such as connection terminals 261 through 268 and 271 through 278. Connection terminals of devices with pin grid array (PGA) packages are pins, and connection terminals of devices with ball grid array (BGA) packages are solder balls.

Figure 2:
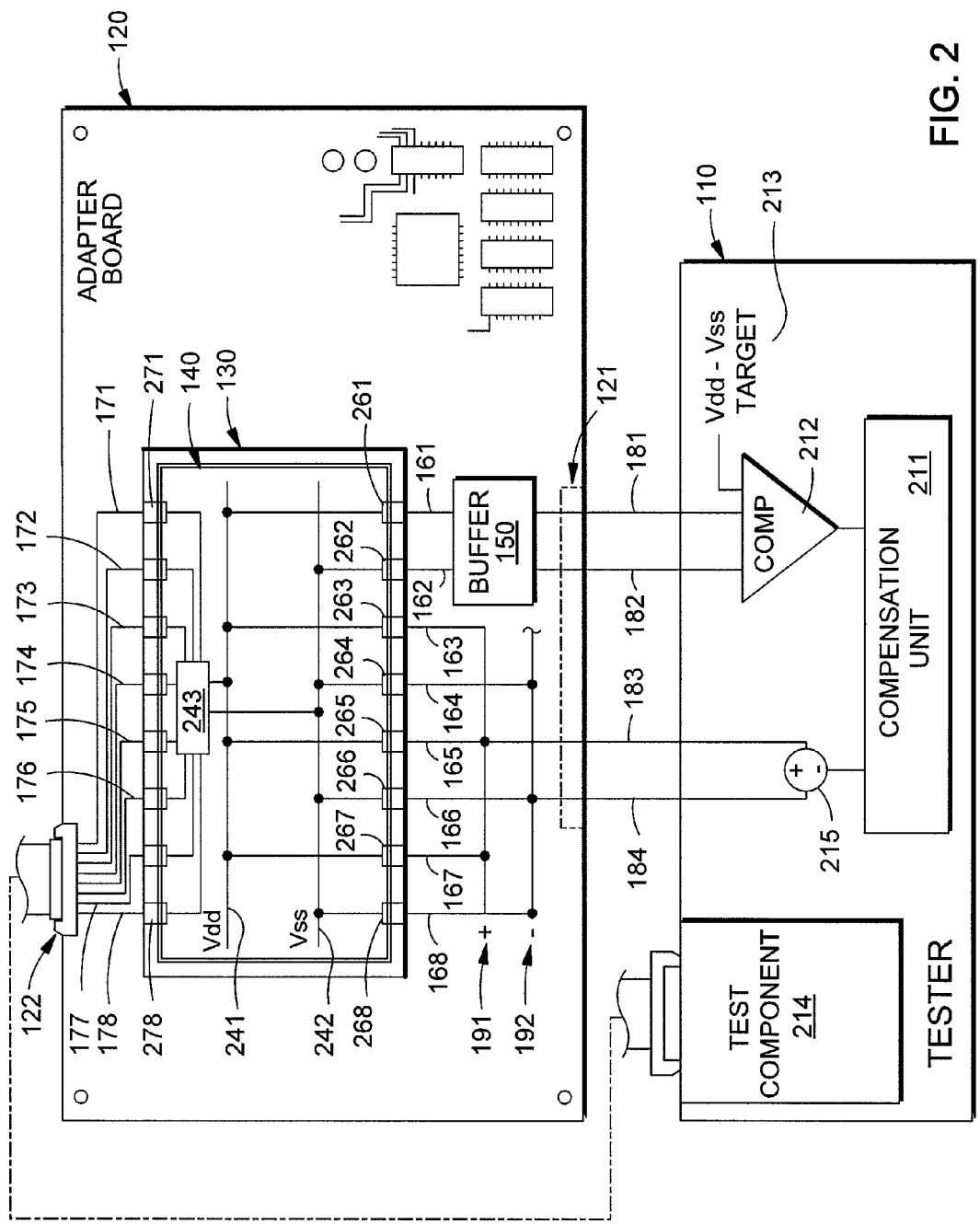
FIG. 2. is a schematic diagram depicting test equipment configured for testing a device in accordance with an exemplary embodiment of the invention.

As seen in FIG. 2, device 140 includes an internal power bus including a Vdd component, such as Vdd 241, and a Vss component, such as Vss 242. Also, DUT 140 includes internal circuitry, such as circuit 243, which is the circuitry being subjected to testing, i.e., the object of test. The internal power bus and internal circuitry connect to the device's connection terminals, via internal circuit pathways, for receiving power and for sending and receiving test signals.

Two or more power connection terminals connect to each component of the internal power bus, positioned in any manner. Here, device 140 has eight power connection terminals connected to the internal power bus, four power connection terminals (e.g., 261, 263, 265, 267) connected to Vdd 241, and four power connection terminals (e.g., 262, 264, 266, 268) connected to Vss 242, as seen in FIG. 2.

Also, any number of signal connection terminals connect to the internal circuitry, for receiving input signals and/or sending output signals, positioned in any manner. Here, device 140 has eight signal connection terminals (e.g., 271 through 278) connected to circuit 243. The test equipment can perform testing by supplying input signals to circuit 243 via input signal connection terminals, extracting output signals from circuit 243 via output signal connection terminals, and comparing the values of the output signals to values in a test specification.

Adapter board 120 is a printed circuit board (PCB), or any other suitable type of adapter board, and the like. Adapter board 120 includes circuits for simulating a field environment for testing a DUT. This circuitry includes integrated circuits, discrete components, and the like. For example, an adapter board for testing a network card microprocessor DUT includes circuitry that simulates a network card deployed in the field under actual use. Also, adapter board 120 includes circuits for creating the test environment, such as buffer 150, and one or more power supply busses, such as adapter board Vdd bus 191 and adapter board Vss bus 192.

Adapter board 120 includes leads, such as leads 161 through 168, 171 through 178, and 181 through 184, and connectors, such as connectors 121 and 122, for connecting to testers, such as tester 110, input devices, output devices, power supplies, and the like. Leads include solder traces, wires, cables, ribbon cable, jumpers, and the like.

The connectors enable adapter board 120 to removably connect to testers, such as tester 110, input devices, output devices, power supplies, and the like. Connectors include sockets, plugs, bus connectors, and the like. Bus connectors are, for example, USB, PCI, PXI, LAN, GPIB, and VXI bus connectors, and the like.

Adapter board 120 includes socket 130. Socket 130 is a removably attachable socket having pogo pins, or any other suitable socket, and the like. Socket 130 has two sides, one side attaching to adapter board 120, and another side holding device 140. The side of socket 130 holding device 140 has one or more contact points (e.g., 61 through 68 and 71 through 78) for connecting to each of device 140's connection terminals. Contact points of sockets for holding devices with PGA packages are holes, and contact points of sockets for holding devices with BGA packages are pogo pins. Socket 130's contact points form removably attachable connections with device 140's connection terminals, allowing device 140 to be removed from the socket after testing.

Here, socket 130 has sixteen contact points, eight contact points (e.g., 61 through 68) for forming connections with device 140's eight power connection terminals (e.g., 261 through 268), and eight contact points (e.g., 71 through 78) for forming connections with device 140's eight signal connection terminals (e.g., 271 through 278), respectively.

The side of socket 130 attaching to adapter board 120 includes one or more connection terminals (not shown) connected through the socket to each of the socket's contact points. Socket 130's connection terminals are pins, solder balls, or the like. Here, socket 130's connection terminals attach to adapter board 120 via leads 161 through 168 and 171 through 178.

Tester 110 is a tester capable of sending and receiving test signals to a DUT and supplying power to a DUT. The tester includes a user interface, an operating system, and a power supply 215 (FIG. 2), connected to one or more test components 214 (FIG. 2) via a bus. The user interface is, for example, a software user interface running on a computer. The operating system is, for example, Microsoft Windows, a proprietary operating system, or the like. The bus is USB, PCI, PXI, LAN, GPIB, VXI, or the like. The tester uses the power supply to supply power to a DUT, and uses one or more test components to send and receive signals to a DUT. Compensation unit 211 and comparator unit 212 can be implemented as a combination of hardware and/or software modules.

In the present embodiment, connectors 121 and 122 connect tester 110 to adapter board 120, and socket 130 holds device 140. Buffer 150 is a low pass filter circuit, such as an integrated circuit, a discrete circuit, or the like.

Device 140's eight power connection terminals 261 through 268 are connected to leads 161 through 168 via socket 130, respectively. Also, device 140's eight signal connection terminals 271 through 278 are connected to leads 171 through 178 via socket 130, respectively.

The test equipment is configured to supply power to a first power connection terminal based on a voltage level monitored at a second power connection terminal. Here, the test equipment is configured to supply power to power connection terminals 263 through 268 based on a voltage level monitored at power connection terminals 261 and 262.

Leads 163, 165, and 167 connect power connection terminals 263, 265, and 267 to adapter board Vdd bus 191, and leads 164, 166, and 168 connect power connection terminals 264, 266, and 268 to adapter board Vss bus 192, through socket 130. Tester 110 supplies power to adapter board Vdd bus 191 and adapter board Vss bus 192 via leads 183 and 184.

Leads 161 and 162 connect power connection terminals 261 and 262 to inputs of buffer 150, through socket 130. Leads 181 and 182 connect outputs of buffer 150 to tester 110. Tester 110 monitors the voltages at power connection terminals 261 and 262 through leads 181 and 182, buffer 150, leads 161 and 162, and then socket 130. Leads 171 through 178 connect signal connection terminals 271 through 278 to tester 110, through socket 130.

FIG. 2. is a schematic diagram depicting test equipment configured for testing a device in accordance with the FIG. 1 embodiment of the invention.

As seen in FIG. 2, device 140 is the same as described in the detailed description of FIG. 1. Device 140 includes an internal power bus including a Vdd component, such as Vdd 241, and a Vss component, such as Vss 242. Also, device 140 includes internal circuitry, such as circuit 243. The internal power bus and internal circuitry are interconnected via internal circuit pathways, such as, for example, etchings in the silicon of the device. Also, the internal power bus and internal circuitry are connected to device 140's connection terminals, such as connection terminals 261 through 268 and 271 through 278, via internal circuit pathways, for receiving power and for sending and receiving signals.

In operation, during a pre-test mode, power supply 215 of tester 110 supplies power to Vdd 241 and Vss 242 through adapter board 120. Tester 110 then monitors the voltage of Vdd 241 and Vss 242 through buffer 150, which reduces voltage noise. Comparator unit 212 of tester 110 then compares the monitored voltage of Vdd 241 and the monitored voltage of Vss 242 with Vdd-Vss target 213. If the monitored voltage of Vdd 241 and the monitored voltage of Vss 242 are equal to Vdd-Vss target 213, compensation unit 211 fixes the voltage of power supply 215, and tester 110 enters a test mode where it performs testing by causing test component 214 to send and receive signals to circuit 243.

If the monitored voltage of Vdd 241 and the monitored voltage of Vss 242 are not equal to Vdd-Vss target 213, compensation unit 211 increases the power supplied by power supply 215. Tester 110 continues monitoring the voltage of Vdd 241 and Vss 242 and increasing the power supplied by power supply 215 until the monitored voltage of Vdd 241 and the monitored voltage of Vss 242 are equal to Vdd-Vss target 213, after which the voltages are fixed and tester 110 enters the test mode. During test mode, test component 214 supplies input signals to circuit 243 via input signal connection terminals (e.g., 271 through 278), extracts output signals via output signal connection terminals (e.g., 271 through 278), and compares the values of the output signals to values in a test specification.

Figure 3:
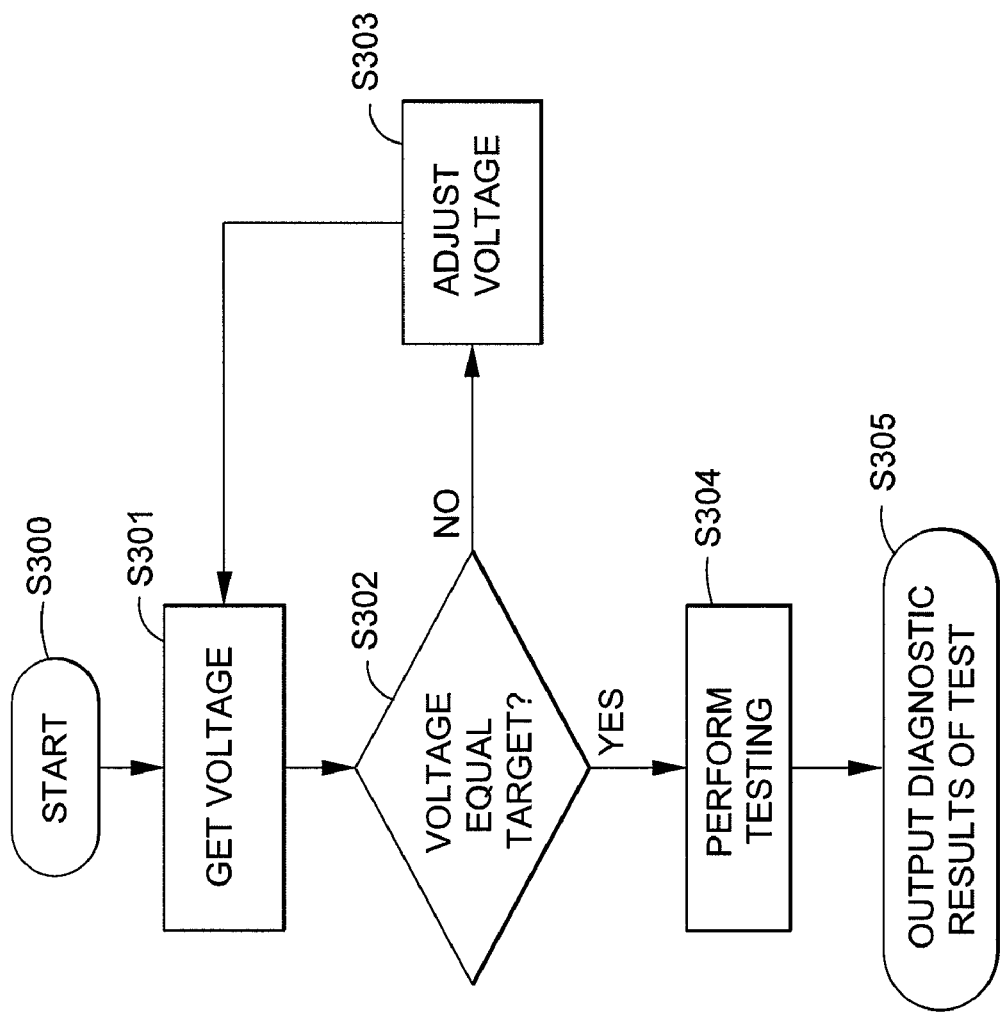
FIG. 3. is a flowchart depicting process steps for testing a device under test.

FIG. 3. is a flowchart depicting the process steps described above for testing a device under test. In step S300, test equipment is configured to supply power to a first power connection terminal of a DUT that has two or more power connection terminals, and monitor power at a second power connection terminal. Once the test equipment is configured, the test equipment supplies power to the DUT, and processing proceeds to step S301.

In step 301, the test equipment monitors a voltage level at the second power connection terminal. After the test equipment acquires the value of the voltage level at the second power connection terminal, processing proceeds to step S302 where the test equipment compares the voltage value acquired in step S301 to a target voltage value.

If the voltage value acquired in step S301 does not equal the target voltage value, processing proceeds to step S303 where the test equipment adjusts the voltage at the second power connection terminal by increasing the power supplied to the DUT. After the test equipment modifies the power supplied to the DUT, processing proceeds to step S301 where the test equipment monitors the voltage at the second power connection terminal again. This process continues until the voltage value acquired in step S301 is within a range of acceptable voltage values in relation the target voltage value.

If the voltage value acquired in step S301 equals the target voltage value, processing proceeds to step S304 where the test equipment performs testing by sending and receiving signals to the DUT, and by comparing the values of received signals to values in a test specification. Once the test equipment has performed testing, processing proceeds to step S305 which outputs diagnostic results of the test and then ends.

While the invention has been particularly shown and described with respect to a preferred embodiment thereof, it will be understood by those skilled in the art that changes in form and details may be made therein without departing from the scope and spirit of the invention.

What is claimed is:

1. Test equipment for a device under test (DUT), comprising:
   an adapter board configured to connect to multiple connection terminals of the DUT via a removably attachable socket which holds the DUT;
   a tester which sends and receives test signals to the DUT through the adapter board and which supplies power to the DUT through the adapter board;
   wherein an internal power bus of the DUT comprises a Vdd component and a Vss component, wherein one of at least two power connection terminals of the DUT connects to the Vdd component and another of the at least two power connection terminals connect to the Vss component, and wherein one of another at least two power connection terminals of the DUT connects to the Vss component and another of the another at least two power connection terminals connect to the Vdd component;

wherein, the adapter board supplies power from the tester to the DUT through the at least two power connection terminals of the DUT and monitors voltage at the another at least two power connection terminals of the DUT; and wherein, the tester includes a compensation unit which controls the power supplied to the DUT based on the voltage monitored at the another at least two power connection terminals.

2. The test equipment according to claim 1, wherein the adapter board is configured to monitor the voltage through a buffer so that voltage noise is reduced.

3. The test equipment according to claim 2, wherein the buffer is a low pass filter.

4. The test equipment according to claim 1, wherein the test equipment operates in a pre-test mode and a test mode, and power is only controlled in pre-test mode and power is fixed for executing the test mode.

5. The test equipment according to claim 4, wherein the test equipment switches from the pre-test mode to the test mode when power supplied to the DUT is sufficient so that the voltage monitored at the another at least two power connection terminals is within a range of acceptable voltage values in relation to a target voltage.

6. The test equipment according to claim 4, wherein the multiple connection terminals include multiple signal connection terminals, and the test equipment performs testing in the test mode by supplying an input signal to the DUT through an input signal connection terminal, extracting an output signal from the DUT through an output signal connection terminal, and comparing the value of the output signal to a value in a test specification.

7. The test equipment according to claim 1, wherein the DUT is an application specific integrated circuit (ASIC).

8. A method for testing an electronic device under test (DUT), wherein the DUT has multiple connection terminals for connecting to a test equipment, the multiple connection terminals including power connection terminals that connect to an internal power bus of the DUT, wherein the internal power bus comprises a Vdd component and a Vss component, the test equipment comprising an adapter board and a tester that includes a compensation unit, the method comprising:

supplying power to first and second power connection terminals of the internal bus of the DUT using the test equipment, the first power connection terminal connected to the Vdd component, and the second connection terminal connected to the Vss component;

monitoring a voltage level at third and fourth power connection terminals of the internal power bus, the third power connection terminal connected to the Vdd component, and the fourth connection terminal connected to the Vss component;

controlling power supplied to the first and second power connection terminals based on the voltage level monitored at the third and fourth power connection terminals;

wherein, the adapter board supplies power from the tester to the DUT through the first and second power connection terminals and monitors voltage at the third and fourth power connection terminals; and wherein, the compensation unit controls power based on the voltage monitored at the third and fourth power connection terminals.

9. The method according to claim 8, wherein the test equipment is configured to monitor the voltage through a buffer so that voltage noise is reduced.

10. The method according to claim 9, wherein the buffer is a low pass filter.

11. The method according to claim 8, wherein the test equipment operates in a pre-test mode and a test mode, and power is only controlled in pre-test mode and power is fixed for executing during test mode.

12. The method according to claim 11, wherein the test equipment switches from the pre-test mode to the test mode when power supplied to the DUT is sufficient so that the voltage monitored at the third and fourth power connection terminals is within a range of acceptable voltage values in relation to a target voltage.

13. The method according to claim 11, wherein the multiple connection terminals include multiple signal connection terminals, and the test equipment performs testing in the test mode by supplying an input signal to the DUT through an input signal connection terminal, extracting an output signal from the DUT through an output signal connection terminal, and comparing the value of the output signal to a value in a test specification.

14. The method according to claim 8, wherein the DUT is an application specific integrated circuit (ASIC).

* * * * *